United States Patent
Cui et al.

(10) Patent No.: US 10,026,792 B2
(45) Date of Patent: Jul. 17, 2018

(54) PIXEL DEFINITION LAYER AND OLED DEVICE INCLUDING THE SAME

(71) Applicant: BOE TECHNOLOGY GROUP CO., LTD., Beijing (CN)

(72) Inventors: Ying Cui, Beijing (CN); Chunjing Hu, Beijing (CN)

(73) Assignee: BOE TECHNOLOGY GROUP CO., LTD, Beijing (CN)

( * ) Notice: Subject to any disclaimer, the term of this patent is extended or adjusted under 35 U.S.C. 154(b) by 0 days.

(21) Appl. No.: 15/512,274

(22) PCT Filed: Feb. 24, 2016

(86) PCT No.: PCT/CN2016/074423
§ 371 (c)(1),
(2) Date: Mar. 17, 2017

(87) PCT Pub. No.: WO2016/138829
PCT Pub. Date: Sep. 9, 2016

(65) Prior Publication Data
US 2017/0278914 A1      Sep. 28, 2017

(30) Foreign Application Priority Data
Mar. 4, 2015   (CN) .......................... 2015 1 0096605

(51) Int. Cl.
*H01L 29/08*       (2006.01)
*H01L 27/32*       (2006.01)

(52) U.S. Cl.
CPC ...... *H01L 27/3246* (2013.01); *H01L 27/3206* (2013.01)

(58) Field of Classification Search
CPC .......................... H01L 27/3246; H01L 27/3206
(Continued)

(56) References Cited

U.S. PATENT DOCUMENTS 9,679,952 B2 * 6/2017 Miyazawa .......... H01L 27/3246
2009/0121983 A1 * 5/2009 Sung .................... H01L 27/3216
                                                                  345/76

(Continued)

FOREIGN PATENT DOCUMENTS

CN      1258428 A      6/2000
CN      1427651 A      7/2003
(Continued)

OTHER PUBLICATIONS

Search Report and Written Opinion dated May 20, 2016 from State Intellectual Property Office of the P.R. China.
(Continued)

*Primary Examiner* — Caleb Henry
(74) *Attorney, Agent, or Firm* — Dilworth & Barrese, LLP.; Michael J. Musella, Esq.

(57) ABSTRACT

A pixel definition layer and an OLED device are provided. The pixel definition layer includes a plurality of openings, the openings each being provided with bottom surface opening, a top surface opening and a side wall. The openings at least include a first opening defining a first pixel unit and a second opening defining a second pixel unit. The first opening is filled with a first pixel luminescent material, and the second opening is filled with a second pixel luminescent material. A decay rate of the first pixel luminescent material is lower than that of the second pixel luminescent material. The area of the bottom surface opening of the first opening is smaller than that of the bottom surface opening of the second opening. The side wall of the opening is provided with a pre-set reference surface. The pixel definition layer can be used for preparing an OLED device.

18 Claims, 2 Drawing Sheets

(58) Field of Classification Search
USPC .......................................................... 257/40
See application file for complete search history.

(56) References Cited

U.S. PATENT DOCUMENTS

| | | | | |
|---|---|---|---|---|
| 2012/0091439 A1* | 4/2012 | Nishiyama | .......... | H01L 27/3216 |
| | | | | 257/40 |
| 2015/0060810 A1* | 3/2015 | Han | .................... | H01L 27/3246 |
| | | | | 257/40 |
| 2015/0060820 A1* | 3/2015 | Takagi | ................ | H01L 51/5218 |
| | | | | 257/40 |
| 2016/0071913 A1* | 3/2016 | Kim | .................... | H01L 27/3246 |
| | | | | 257/40 |
| 2017/0194414 A1* | 7/2017 | Lee | ..................... | H01L 27/3211 |
| 2017/0309692 A1* | 10/2017 | Choi | .................. | H01L 27/3262 |

FOREIGN PATENT DOCUMENTS

| | | |
|---|---|---|
| CN | 101355097 A | 1/2009 |
| CN | 101488519 A | 7/2009 |
| CN | 102577613 A | 7/2012 |
| CN | 103219359 A | 7/2013 |
| CN | 104241329 A | 12/2014 |
| CN | 104635147 A | 5/2015 |
| JP | 2014026322 A | 2/2014 |

OTHER PUBLICATIONS

Chinese Office Action dated May 19, 2016.
Chinese Office Action dated Sep. 27, 2016.

\* cited by examiner

PIXEL DEFINITION LAYER AND OLED DEVICE INCLUDING THE SAME

TECHNICAL FIELD

Embodiments of the present disclosure relate to a pixel definition layer and an OLED device.

BACKGROUND

Organic light emitting diode (OLED) display devices have received broad attention due to features, such as self illumination, wide viewing angle, fast response and flexibility.

In OLED devices, luminescent materials of different colors are relatively different in terms of performance. Red light material has the best performance, green light material has relatively good performance, and blue light material has the poorest performance. Thus, during the use of OLED devices, red light material decays slow, while blue light material decays relatively fast, which may results in severe color cast.

SUMMARY

Embodiments of the present disclosure provide a pixel definition layer and an OLED device.

According to at least one embodiment of the present disclosure, a pixel definition layer is provided. The pixel definition layer includes a plurality of openings defining pixel units of different colors, each opening including a bottom surface aperture, a top surface aperture and a side wall between them; the pixel units at least including a first pixel unit and a second pixel unit; the plurality of openings at least including a first opening defining the first pixel unit and a second opening defining the second pixel unit; the first opening being filled with a first pixel luminescent material and the second opening being filled with a second pixel luminescent material; the first pixel luminescent material having a decay rate smaller than that of the second pixel luminescent material; and a bottom surface aperture of the first opening having an area smaller than a bottom surface aperture of the opening; the sidewall of each opening having a pre-set reference plane; and a space defined by each opening including a body space within the reference plane and an extension space extending outwardly with respect to the reference plane, the extension space of the first opening having a volume greater than that of the extension space of the second opening.

In an example, the pixel unit further includes a third pixel unit and the opening further includes a third opening defining the third pixel unit, the third opening being filled with a third pixel luminescent material. The third pixel luminescent material has a decay rate between that of the first pixel luminescent material and that of the second pixel luminescent material, and the bottom surface aperture of the third opening has an area between that of the bottom surface aperture of the first opening and that of the bottom surface aperture of the second opening.

In an example, the extension space of the third opening has a volume between that of the extension space of the first opening and that of the extension space of the second opening.

In an example, the extension space of the second opening has zero volume.

In an example, the sidewall of the first opening at least includes a first sidewall, a second sidewall, and a connecting wall for connecting the two sidewalls. The first sidewall is connected with an edge of the bottom surface aperture, and the second sidewall is located on an outer side of the first sidewall with respect to the reference plane.

In an example, the first sidewall is parallel to the reference plane.

In an example, an angle between the first sidewall and a plane in which the bottom surface aperture is located is smaller than an angle between the second sidewall and a plane in which the bottom surface aperture is located.

In an example, the pixel definition layer is formed by at least two patterning processes.

In an example, the pixel definition layer formed by two patterning processes is of different materials. The pixel definition layer formed by a first patterning process is of a hydrophilic material, and the pixel definition layer formed by a second patterning process is of a hydrophobic material.

According to an embodiment of the present disclosure, an OLED device is provided, which includes a cathode, an anode and the pixel definition layer.

BRIEF DESCRIPTION OF THE DRAWINGS

Embodiments of the present disclosure will be described in more detail below with reference to accompanying drawings to allow an ordinary skill in the art to more clearly understand embodiments of the present disclosure, in which.

DETAILED DESCRIPTION

Technical solutions according to the embodiments of the present disclosure will be described clearly and fully as below in conjunction with the accompanying drawings of embodiments of the present disclosure. It is apparent that the described embodiments are just a part but not all of the embodiments of the disclosure. Based on the described embodiments herein, an ordinary skill in the art can obtain other embodiment(s), without any creative work, which shall be within the scope of the present disclosure.

Unless otherwise defined, all the technical and scientific terms used herein have the same meanings as commonly understood by one of ordinary skill in the art to which the present disclosure belongs. The terms, such as "first," "second," or the like, which are used in the description and the claims of the present disclosure, are not intended to indicate any sequence, amount or importance, but for distinguishing various components. Also, the terms, such as "a," "an," "the" or the like, are not intended to limit the amount, but for indicating the existence of at lease one. The terms, such as "comprise/comprising," "include/including," or the like are intended to specify that the elements or the objects stated before these terms encompass the elements or the objects and equivalents thereof listed after these terms, but not preclude other elements or objects. The terms, "on," "under," or the like are only used to indicate relative position relationship, and when the position of the object which is described is changed, the relative position relationship may be changed accordingly.

Figure 1:
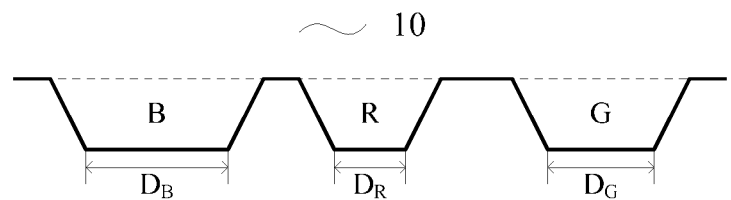
FIG. 1 is a schematic structural diagram of a pixel definition layer.

The inventor found out that, to allow consistent decaying states of luminescent materials of various colors in use of an OLED device, as shown in FIG. 1, when designing an OLED device, the aperture ratio of red pixel units R are required to be designed smallest, the aperture ratio of green pixel units are required to be smaller, while the aperture ratio of blue pixel units B are required to be designed larger.

Red light has long wavelengths, the length of optical cavity that determines its pixels is long too, then the film thickness of luminescent layer of red light material is relatively thick. For the OLED devices that adopt the above-mentioned design, while an organic luminescent material is prepared by using a solution method, such as ink jet printing method, since red pixel units have relatively small aperture ratio, the volume of ink they contain is relatively small too, while the film thickness of themselves is thick, more ink is needed. Based on the above reason, ink in red pixel units tends to overflow to adjacent other pixel units, resulting in cross color.

Figure 2:
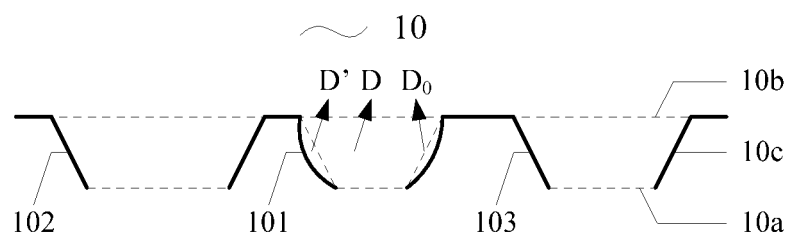
FIG. 2 is a schematic structural diagram I of a pixel definition layer provided in an embodiment of the present disclosure.
Figure 3:
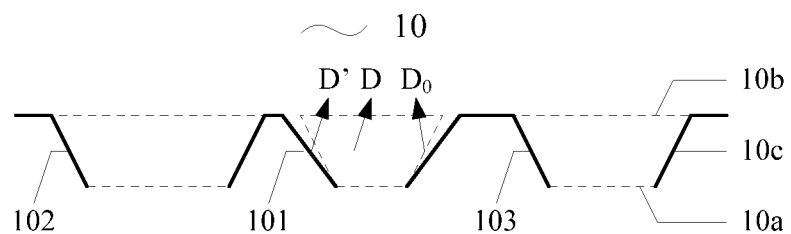
FIG. 3 is a schematic structural II of a pixel definition layer provided in an embodiment of the present disclosure.
Figure 4:
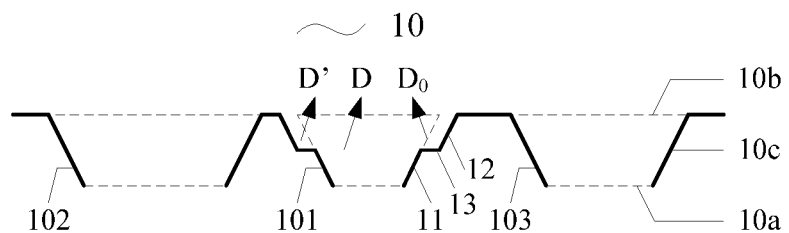
FIG. 4 is a schematic structural diagram III of a pixel definition layer provided in an embodiment of the present disclosure.

An embodiment of the present disclosure provides a pixel definition layer 10. As shown in FIGS. 2 to 4, it includes a plurality of openings defining pixel units of different colors, in which each opening has a bottom surface aperture 10a, a top surface aperture 10b, and a sidewall 10c between them.

The pixel units at least include a first pixel unit and a second pixel unit. The opening at least includes a first opening 101 defining the first pixel unit and a second opening 102 defining the second pixel unit. The first opening 101 is filled with a first pixel luminescent material and the second opening 102 is filled with a second pixel luminescent material. The first pixel luminescent material has a decay rate smaller than that of the second pixel luminescent material, and the bottom surface aperture of the first opening 101 has an area smaller than that of the second opening 102.

The sidewall 10c of the opening has a pre-set reference plane $D_0$. The space defined by the opening includes a body space D within the reference plane $D_0$ and an extension space D' extending outwardly with respect to the reference plane $D_0$. The volume of the extension space D' of the first opening 101 is greater than that of the extension space D' of the second opening 102.

It is noted that designs for openings corresponding to different pixel units in embodiments of the present disclosure are all based on the premise of not changing the aperture ratio of the pixel units. That is, the aperture ratio of the pixel units in the present disclosure is kept consistent with that of corresponding pixel units in the art. The aperture ratio of the pixel units can be determined by the area of bottom surface apertures of the openings.

The pixel definition layer 10 is mainly applied to the case in which the organic material functional layer is prepared by a solution method. The solution method may include, for example, ink jet printing method, continuous printing method, electro-static coating method, and slit coating method, or the like. For example, when an organic material functional layer is prepared with solution method, such as ink jet printing method, under the condition that the ink solvent type, composition and concentration of the organic luminescent material are not changed, adopting the above-mentioned pixel definition layer 10 can effectively improve the capability of containing ink for openings of small aperture ratio, so as to address the cross color problem of display devices. The pixel definition layer 10 may be also applied to the case in which the organic material functional layer is prepared by other methods, however, if it uses the pixel definition layer 10 of the above-mentioned structure, it should be all within the scope of the present disclosure.

The openings of the pixel definition layer 10 are filled with luminescent material therein, and the luminescent material can only be excited to generate electrons/holes while contacting the electrodes. In this way, the openings of the pixel definition layer 10 are actually vias or through holes penetrating from top to bottom, and their bottom surface apertures 10a are connected with the bottom electrodes, and the top surface apertures 10b are connected with the top electrodes.

In this way, the pixel definition layer 10 is configured to define pixel units of different colors, and in order to prevent cross color caused by solution overflowing between adjacent pixel units, a certain preserved spacing should be maintained between two adjacent openings of the pixel definition layer 10.

Figure 5:
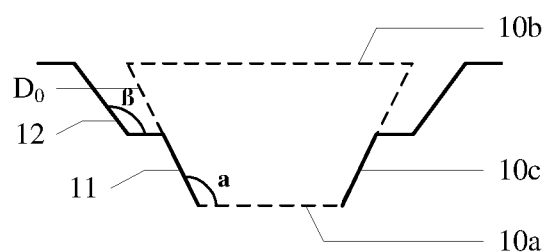
FIG. 5 is a schematic diagram of an opening structure of a pixel provided in an embodiment of the present disclosure.

In an embodiment of the present disclosure, as shown in FIG. 5, the reference plane $D_0$ refers to a side surface that forms a preset angle α with the plane in which the bottom surface apertures 10a are located. For example, in a practical preparing process, the reference plane $D_0$ forms generally an angle of 135° with the plane in which the bottom surface apertures 10a are located. However, the embodiments of the present disclosure are not limited thereto, the angle may be set to other values as needed.

With the reference plane $D_0$ as a boundary surface, the interior of the opening may be divided into a body space D and an extension space D'. The inner side of the reference plane $D_0$ is the body space D, and the outer side of the reference plane $D_0$ is the extension space D'.

Here, the inner side of the reference plane $D_0$ refers to the side that points to the interior of the opening, the outer side of the reference plane $D_0$ refers to the side away from the interior of the opening. The interior of the opening refers to the region to be filled with luminescent material.

In embodiments of the present disclosure, as long as any two kinds of luminescent materials can satisfy that the first pixel luminescent material has a decay rate smaller than the decay rate of the second pixel luminescent material, the two openings to be filled with these two kinds of pixel luminescent materials may be designed according to the above-mentioned requirements. That is, the bottom surface aperture of the first opening 101 has an area smaller than that of the second opening 102, and the extension space D' of the first opening 101 has a volume greater than that of the second opening 102.

Exemplarily, in routine pixel luminescent materials, red pixel luminescent material has a decay rate smaller than that of green pixel luminescent material and green pixel luminescent material has a decay rate smaller than that of blue pixel luminescent material. In this way, openings corresponding to red pixel units, green pixel units and blue pixel units respectively may be designed according to the above requirements. It is also possible to design only openings corresponding to two kinds of pixel units according to the above requirement, while openings corresponding to other kinds of pixel units may be designed according to a routine method.

An embodiment of the present disclosure provides a pixel definition layer 10 that can allow a consistent decay state of luminescent materials corresponding to pixel units, and increase internal volume of openings with small area of bottom surface apertures to enhance their capability of containing solution, avoid solution overflow caused by insufficient volume and prevent cross color by providing openings (namely the first openings 101) corresponding to the pixel luminescent material with slow pixel decay rate (namely the first pixel luminescent material) with small bottom surface aperture areas and large extension spaces, and providing openings (namely the second openings 102) corresponding to the pixel luminescent material with fast pixel decay rate (namely the second pixel luminescent material) with large bottom surface aperture areas and small extension spaces.

Optionally, as shown in FIGS. 2 to 4, the pixel unit further includes third pixel units and the openings further include third openings 103 configured to define the third pixel units. The third openings 103 are filled with the third pixel luminescent material.

Moreover, the third pixel luminescent material has a decay rate between the first pixel luminescent material and the second pixel luminescent material. The bottom surface aperture of the third opening 103 has an area between that of the first opening 101 and the second opening 102. The extension space D' of the third opening 103 has a volume between that of the first opening 101 and that of the second opening 102.

Here, it is to be noted that the volume of extension space D' of the third opening 103 being between that of the first opening 101 and that of the second opening 102 may include the case in which the volume of the extension space D' of the third opening 103 is equal to that of the first opening 101 or that of the second opening 102. In embodiments of the present disclosure, to facilitate description, an example will be described below, in which these three volumes are not equal to each other.

As can be known from the above description, decay rate of the first pixel luminescent material, decay rate of the third pixel luminescent material, and decay rate of the second pixel luminescent material increase in turn, the area of bottom surface aperture of the first opening 101, the area of bottom surface aperture of the third opening 103, and the area of bottom surface aperture of the second opening 102 increase in turn, and the volume of extension space of the first opening 101, the volume of extension space of the third opening 103, and the volume of extension space of the second opening 102 decrease in turn.

In this way, the first opening 101, the second opening 102 and the third opening 103 may be used to define the first pixel unit, the second pixel unit and the third pixel unit, respectively. The first pixel unit, the second pixel unit and the third pixel unit may correspond to red pixel unit, blue pixel unit and green pixel unit, respectively. In this way, the first pixel unit, the second pixel unit and the third pixel unit may constitute basic pixels of an OLED display.

The above correspondence relationship between pixel units and colors is described exemplarily. If the OLED also includes pixels of colors other than red, green and blue, they may also be designed in terms of openings according to the above-mentioned rule.

Optionally, the extension space D' of the second opening 102 may have a volume of zero. That is, the interior of the second opening 102 may only include the body space D without an extension space D'.

In this way, as compared to a routine technique, the first opening 101 has a changed shape, the second opening 102 does not need to change the shape, and the shape for the third opening 103 may be designed according to the above-mentioned principle as needed.

Based on the above description, optionally, with reference to FIG. 2, the sidewall 10c of the first opening 101 may be of a recessed arc surface. The profile of the sidewall of the first opening 101 may be implemented by a dry etching process.

Here, by etching the sidewall 10c of the first opening 101 into a recessed arc surface such that it is below the reference plane D0 (that is, the sidewall 10c is offset to the side of the bottom surface aperture 10a relative to the reference plane $D_0$), it is possible to increase the internal volume of the first opening 101 without changing the aperture ratio, and the capability of containing solution is increased.

Alternatively, optionally, referring to FIG. 3, the sidewall 10c of the first opening 101 may also be of a plane, but it is required that the plane is below the reference plane $D_0$ (that is, the sidewall 10c is offset to the side of the bottom surface aperture 10a relative to the reference plane $D_0$).

In this way, the internal volume of the first opening 101 is increased without changing the aperture ratio, and its capability of containing solution is increased.

In an embodiment of the present disclosure, preferably, with reference to FIG. 4, the sidewall 10c of the first opening 101 at least includes a first sidewall 11 and a second sidewall 12, and a connecting wall 13 therebetween. The first sidewall 11 and the bottom surface aperture 10a are connected at edges, and the second sidewall 12 is located on the outer side of the first sidewall 11 relative to the reference plane $D_0$.

Here, it is to be noted that the outer side of the reference plane $D_0$ refers to the side away from the interior (namely the region for filling luminescent material) of the opening with the reference plane $D_0$ as the boundary surface.

For example, if the plane in which the bottom surface aperture 10a is located as the bottom surface of the pixel definition layer 10, both the projection of the first sidewall 11 on the bottom surface and the projection of the second sidewall 12 on the bottom surface are of ring shape, and the projection of the first sidewall 11 is located within the projection of the second sidewall 12.

In this way, in the direction perpendicular to the bottom surface of the pixel definition layer 10, a step would be formed between the first sidewall 11 and the second sidewall 12, namely the connecting wall 13. In this way, the second sidewall 12 expands outwardly with respect to the reference plane $D_0$, so that the volume of the upper part of the first opening 101 is increased.

In this way, while satisfying the condition of increasing the internal volume of the first opening 101 without changing the aperture ratio, the sidewall 10c of the first opening 101 can include not only the first sidewall 11 and the second sidewall 12, but also include more sidewalls.

It is noted from the above description, by designing the sidewall 10c of the first opening 101 as a multilayer structure, it is possible to effectively increase the internal volume of the first opening 101, and enhancing its capability of containing solution. Furthermore, this pixel definition layer 10 has a relatively simple structure and is readily for mass production.

For example, with reference to FIG. 5, the first sidewall 11 may be parallel to the reference plane $D_0$; that is, given a constant size of the bottom surface aperture 10a, the first sidewall 11 may exactly coincide with the reference plane $D_0$.

Moreover, the second sidewall 12 may also be parallel to the reference plane $D_0$. However, the embodiments of the present disclosure are not limited thereto.

In an embodiment of the present disclosure, for example, with reference to FIG. 5, the angle α between the first sidewall 11 and the plane in which the bottom surface aperture 10a is located may be smaller than the angle β between the second sidewall 12 and the plane in which the bottom surface aperture 10a is located.

The angle between the first sidewall 11 and the plane in which the bottom surface aperture 10a is located refers to the angle formed by them inside the opening, namely the angle α shown in FIG. 5. The angle between the second sidewall 12 and the plane in which the bottom surface aperture 10a is located also refers to the angle formed by them inside the opening, namely the angle β shown in FIG. 5.

In this way, for the first opening 101 of the pixel definition layer 10, it is possible to form a structure with an upper part slope angle greater than a lower part slope angle. In this case, the first sidewall 11 has a large slope, and the second sidewall 12 has a small slope. In this way, during an organic material functional layer is prepared, it is possible to speed up flow of the organic material, so as to prevent the organic material from remaining on the sidewall 10c.

Based on the above-mentioned case, in an instance that the sidewall 10c of the first opening 101 at least includes a first sidewall 11 and a second sidewall 12, the pixel definition layer 10 may be prepared by at least two patterning processes.

Exemplarily, when the sidewall 10c of the first opening 101 includes only the first sidewall 11 and the second sidewall 12, the preparing process of the pixel definition layer 10 is as follows. First, a first layer of pixel definition layer is formed by a single patterning process, which includes first openings 101 defining red pixel units R, second openings 102 defining blue pixel units B, and third openings 103 defining green pixel units G. In this way, a first sidewall 11 is formed at the first opening 101. Then, a second layer of pixel definition layer is formed by a single patterning process, which includes first openings 101, second openings 102, and third openings 103 corresponding to various openings of the first layer of pixel definition layer. In this way, a second sidewall 12 is formed at the first opening 101.

In this way, under the condition of having openings of the pixel definition layer 10 correspond to each other up and down, it is possible to form the lower part of the pixel definition layer 10 by the first patterning process, and form the upper part of the pixel definition layer 10 by the second patterning process.

In this way, since the upper and lower parts of the pixel definition layer 10 are formed by two patterning processes, respectively, it is readily to control the internal volumes and the side slopes of the openings in the etching process and the prepare process is simplified.

In this way, the pixel definition layer 10 may be prepared by two patterning processes from different materials. The lower part of the pixel definition layer prepared by the first patterning process may be of a hydrophilic material, and the upper part of the pixel definition layer prepared by the second patterning process may be of a hydrophobic material. For example, the material of the pixel definition layer 10 may be an organic resin material.

In this way, the pixel definition layer 10 prepared by two patterning processes has a two-layer structure. The lower pixel definition layer is of a hydrophilic material in favor of tiling of liquid drops; and the upper pixel definition layer is of a hydrophobic material that may allow liquid drops not to flow out easily to avoid cross color caused by solution overflow.

Figure 6:
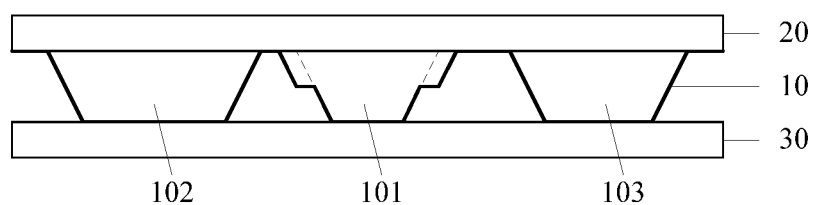
FIG. 6 is a schematic structural diagram of an OLED device provided in an embodiment of the present disclosure.

An embodiment of the present disclosure also provides an OLED device as shown in FIG. 6, including a cathode 20, an anode 30 and the above-mentioned pixel definition layer 10.

In this way, when filling solution of organic luminescent material in the above-mentioned pixel definition layer 10 with the solution method, since the internal volume of the first opening 101 of the corresponding first pixel unit, for example, the red pixel unit, is increased, it is possible to effectively avoid solution overflow caused by insufficient volume, and prevent solution overflowing to adjacent pixel units. In this way, cross color is avoided.

Embodiments of the present disclosure provide a pixel definition layer and an OLED device. For the pixel definition layer, it is possible to not only allow a consistent decay state of luminescent materials corresponding to pixel units, but also can increase internal volume of openings with small area of bottom surface apertures to enhance their capability of containing solution, as well as avoid solution overflow caused by insufficient volume and prevent cross color by having openings corresponding to the luminescent material with slow decay speed (namely the first pixel luminescent material) to have small bottom surface aperture area and large extension space, and having openings corresponding to the luminescent material with fast decay speed (namely the second pixel luminescent material) to have large bottom surface aperture area and small extension space.

The foregoing is only the exemplary embodiments of the present disclosure and not intended to limit the scope of the present disclosure. All the changes or alternations which may be readily contemplated by an ordinary skill in the art within the technical scope disclosed by the embodiments of the present disclosure shall fall within the scope of the present disclosure.

The present application claims priority to the Chinese patent application No. 201510096605. X entitled "Pixel Definition Layer and OLED Device" filed on Mar. 4, 2015, which is incorporated herein in its entirety by reference.

What is claimed is:

1. A pixel definition layer, comprising a plurality of openings defining pixel units of different colors, each opening including a bottom surface aperture, a top surface aperture and a side wall between them; wherein the pixel units at least include a first pixel unit and a second pixel unit;

the plurality of openings at least include a first opening defining the first pixel unit and a second opening defining the second pixel unit;

the first opening is filled with a first pixel luminescent material and the second opening is filled with a second pixel luminescent material;

the first pixel luminescent material has a decay rate smaller than that of the second pixel luminescent material, and a bottom surface aperture of the first opening has an area smaller than a bottom surface aperture of the second opening;

the sidewall of each opening has a preset reference plane; and a space defined by each opening includes a body space within the reference plane and an extension space extending outwardly with respect to the reference plane, the extension space of the first opening having a volume greater than that of the extension space of the second opening;

wherein the pixel definition layer is a double-layer structure including a first layer and second layer formed by two patterning processes using different materials, the first layer including a hydrophilic material, and the second layer including a hydrophobic material.

2. The pixel definition layer according to claim 1, wherein the pixel unit further comprises a third pixel unit and the opening further comprises a third opening defining the third pixel unit, the third opening being filled with a third pixel luminescent material;

wherein the third pixel luminescent material has a decay rate between that of the first pixel luminescent material and that of the second pixel luminescent material, and the bottom surface aperture of the third opening has an area between that of the bottom surface aperture of the first opening and that of the bottom surface aperture of the second opening.

3. The pixel definition layer according to claim 2, wherein the extension space of the third opening has a volume between that of the extension space of the first opening and that of the extension space of the second opening.

4. The pixel definition layer according to claim 1, wherein the extension space of the second opening has zero volume.

5. The pixel definition layer according to claim 1, wherein the sidewall of the first opening at least comprises a first sidewall, a second sidewall, and a connecting wall for connecting the two sidewalls;

wherein the first sidewall is connected with an edge of the bottom surface aperture, and the second sidewall is located on an outer side of the first sidewall with respect to the reference plane.

6. The pixel definition layer according to claim 5, wherein the first sidewall is parallel to the reference plane.

7. The pixel definition layer according to claim 6, wherein an angle between the first sidewall and a plane in which the bottom surface aperture is located is smaller than an angle between the second sidewall and a plane in which the bottom surface aperture is located.

8. The pixel definition layer according to claim 5, wherein an angle between the first sidewall and a plane in which the bottom surface aperture is located is smaller than an angle between the second sidewall and a plane in which the bottom surface aperture is located.

9. The pixel definition layer according to claim 1, wherein the extension space of the third opening has a volume between that of the extension space of the first opening and that of the extension space of the second opening.

10. The pixel definition layer according to claim 9, wherein the extension space of the second opening has zero volume.

11. The pixel definition layer according to claim 10, wherein the sidewall of the first opening at least comprises a first sidewall, a second sidewall, and a connecting wall for connecting the two sidewalls;

wherein the first sidewall is connected with an edge of the bottom surface aperture, and the second sidewall is located on an outer side of the first sidewall with respect to the reference plane.

12. The pixel definition layer according to claim 11, wherein the first sidewall is parallel to the reference plane.

13. An OLED device comprising a cathode, an anode and a pixel definition layer, wherein the pixel definition layer comprises:

a plurality of openings defining pixel units of different colors, each opening including a bottom surface aperture, a top surface aperture and a side wall between them; wherein the pixel units at least include a first pixel unit and a second pixel unit;

the plurality of openings at least include a first opening defining the first pixel unit and a second opening defining the second pixel unit;

the first opening is filled with a first pixel luminescent material and the second opening is filled with a second pixel luminescent material;

the first pixel luminescent material has a decay rate smaller than that of the second pixel luminescent material, and a bottom surface aperture of the first opening has an area smaller than a bottom surface aperture of the second opening;

the sidewall of each opening has a preset reference plane; and a space defined by each opening includes a body space within the reference plane and an extension space extending outwardly with respect to the reference plane, the extension space of the first opening having a volume greater than that of the extension space of the second opening;

wherein the pixel definition layer is a double-layer structure including a first layer and second layer formed by two patterning using different materials, the first layer including a hydrophilic material, and the second layer including a hydrophobic material.

14. The OLED device according to claim 13, wherein the pixel unit further comprises a third pixel unit and the opening further comprises a third opening defining the third pixel unit, the third opening being filled with a third pixel luminescent material;

wherein the third pixel luminescent material has a decay rate between that of the first pixel luminescent material and that of the second pixel luminescent material, and the bottom surface aperture of the third opening has an area between that of the bottom surface aperture of the first opening and that of the bottom surface aperture of the second opening.

15. The OLED device according to claim 14, wherein the extension space of the third opening has a volume between that of the extension space of the first opening and that of the extension space of the second opening.

16. The OLED device according to claim 13, wherein the extension space of the second opening has zero volume.

17. The OLED device according to claim 13, wherein the sidewall of the first opening at least comprises a first sidewall, a second sidewall, and a connecting wall for connecting the two sidewalls;

wherein the first sidewall is connected with an edge of the bottom surface aperture, and the second sidewall is located on an outer side of the first sidewall with respect to the reference plane.

18. The OLED device according to claim 17, wherein the first sidewall is parallel to the reference plane.

* * * * *